(12) United States Patent
Nguyen et al.

(10) Patent No.: US 11,156,778 B2
(45) Date of Patent: Oct. 26, 2021

(54) METHOD FOR MANUFACTURING A SEMICONDUCTOR STRUCTURE

(71) Applicant: Soitec, Bernin (FR)

(72) Inventors: Bich-Yen Nguyen, Austin, TX (US); Gweltaz Gaudin, Crolles (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/323,238

(22) PCT Filed: Jul. 27, 2017

(86) PCT No.: PCT/EP2017/068979
§ 371 (c)(1),
(2) Date: Feb. 4, 2019

(87) PCT Pub. No.: WO2018/024595
PCT Pub. Date: Feb. 8, 2018

(65) Prior Publication Data
US 2019/0187376 A1 Jun. 20, 2019

(30) Foreign Application Priority Data
Aug. 4, 2016 (FR) ...................... 1657575

(51) Int. Cl.
*H01L 21/76* (2006.01)
*G02B 6/132* (2006.01)
(Continued)

(52) U.S. Cl.
CPC ............. *G02B 6/132* (2013.01); *G02B 6/136* (2013.01); *H01L 21/76251* (2013.01)

(58) Field of Classification Search
None
See application file for complete search history.

(56) References Cited

U.S. PATENT DOCUMENTS 5,968,239 A * 10/1999 Miyashita ................ C09G 1/02
106/3
6,048,775 A * 4/2000 Yao .................... H01L 21/76224
257/E21.546
(Continued)

FOREIGN PATENT DOCUMENTS

CN 1610967 A 4/2005
CN 104335088 B 11/2017
(Continued)

OTHER PUBLICATIONS

International Written Opinion for International Application No. PCT/EP2017/068979, dated Nov. 7, 2017, 6 pages.
(Continued)

*Primary Examiner* — Bradley Smith
(74) *Attorney, Agent, or Firm* — TraskBritt

(57) ABSTRACT

A method for manufacturing a semiconductor structure or a photonic device, wherein the method comprises the steps of: providing a silicon nitride patterned layer over a carrier substrate; providing a first layer of a conformal oxide on the silicon nitride patterned layer such that it fully covers the silicon nitride patterned layer; and planarizing the first layer of conformal oxide to a predetermined thickness above the silicon nitride patterned layer to form a planarizing oxide layer. After the step of planarizing the first layer of conformal oxide, the method further comprises steps of clearing the silicon nitride patterned layer to form a dished silicon nitride patterned layer with a dishing height; and subsequently providing a second layer of a conformal oxide on or over the dished silicon nitride layer.

19 Claims, 3 Drawing Sheets

(51) Int. Cl.
  *G02B 6/136* (2006.01)
  *H01L 21/762* (2006.01)

(56) References Cited

U.S. PATENT DOCUMENTS

| | | | | |
|---|---|---|---|---|
| 6,057,210 | A * | 5/2000 | Yang | H01L 21/76224 |
| | | | | 148/DIG. 50 |
| 6,191,003 | B1 * | 2/2001 | Lin | H01L 21/3212 |
| | | | | 257/E21.304 |
| 6,500,729 | B1 * | 12/2002 | Chittipeddi | H01L 21/76224 |
| | | | | 257/E21.546 |
| 2008/0020534 | A1 * | 1/2008 | Culmsee | H01L 21/76229 |
| | | | | 438/296 |
| 2015/0140720 | A1 * | 5/2015 | Collins | G02B 6/13 |
| | | | | 438/65 |

FOREIGN PATENT DOCUMENTS

| | | |
|---|---|---|
| EP | 2648025 A1 | 10/2013 |
| JP | 2002-076110 A | 3/2002 |
| JP | 2010-074192 A | 4/2010 |
| JP | 2015-005772 A | 1/2015 |
| JP | 2015-527608 A | 9/2015 |
| WO | 2009/051903 A1 | 4/2009 |
| WO | 2014/009029 A1 | 1/2014 |
| WO | 2018/024595 A1 | 2/2018 |

OTHER PUBLICATIONS

International Search Report for International Application No. PCT/EP2017/068979, dated Nov. 7, 2017, 3 pages.
Japanese Notice of Reasons for Rejection for Japanese Application No. 2019-504704 dated Feb. 25, 2020, 2 pages.
Chinese First Office Action for Chinese Application No. 201780056607.3 dated Mar. 3, 2020, 9 pages.
European Communication pursuant to Article 94(3) EPC for European Application No. 17752037, dated Jul. 21, 2020, 4 pages.
Korean Grant of Patent for Korean Application No. 10-2019-7004687, dated Aug. 4, 2020, 2 pages with English Translation.

* cited by examiner

METHOD FOR MANUFACTURING A SEMICONDUCTOR STRUCTURE

CROSS-REFERENCE TO RELATED APPLICATIONS

This application is a national phase entry under 35 U.S.C. § 371 of International Patent Application PCT/EP2017/068979, filed Jul. 27, 2017, designating the United States of America and published in English as International Patent Publication WO 2018/024595 A1 on Feb. 8, 2018, which claims the benefit under Article 8 of the Patent Cooperation Treaty to French Patent Application Serial No. 1657575, filed Aug. 4, 2016.

TECHNICAL FIELD

The present disclosure relates to the co-integration of active and passive patterned semiconductor devices. In particular, the present disclosure relates to a method for manufacturing a semiconductor structure for photonic applications comprising a silicon nitride patterned layer, wherein the silicon nitride patterned layer forms a passive device.

BACKGROUND

The 3-D integration of semiconductor structures using layer transfer technologies seems promising for the future development of semiconductor devices comprising multiple functions. Such devices may comprise, at different levels, silicon nitride (SiN) patterned layers or structures such as Shallow Trench Isolation (STI) patterns, SiN patterns present in the gate stack of a transistor, SiN patterned layers functioning as waveguides, or the like.

Furthermore, in particular for photonic applications, the co-integration via bonding of active silicon (Si) devices, on one hand, and passive SiN patterned devices, on the other hand, seems promising for further developments. In these applications, SiN is a material that is typically preferred for the patterned structure, as it exhibits low propagation losses and substantially constant optical properties as a function of temperature. WO 2014/009029 A1 discloses a known method for manufacturing a photonic circuit with active Si and passive SiN patterned structures.

However, such 3-D integration methods have very strict requirements regarding thickness uniformity, which are particularly important for the performance of photonic devices for which the optical coupling between the devices (active silicon devices) in the layers bonded via the SiN "waveguide" is important.

Thus, covering the SiN patterned structure with a bonding layer or planarizing conformal oxide, typically silicon dioxide ($SiO_2$), which needs to be both very thin and very uniform, is a major challenge in this context.

Typically, as disclosed in WO 2014/009029 A1, known methods of 3-D integration of semiconductor structures for manufacturing photonic circuits using layer transfer technologies start by patterning a high refractive index waveguide SiN layer on a Si wafer to generate a patterned high refractive index waveguide layer with passive photonic structures, then planarizing the patterned layer with a conformal oxide ($SiO_2$), and annealing the patterned layer before and/or after the planarizing oxide layer to generate an annealed and patterned high refractive index waveguide layer and planarizing oxide layer. The structure is then bonded at the planarizing oxide layer to a donor Si wafer with a detachable monocrystalline Si layer, and the substrate of the donor wafer is then removed. Surface treatments are then performed in order to manufacture active photonic devices in the monocrystalline Si layer that is left on top (of the planarizing oxide layer) of the annealed and patterned high refractive index waveguide layer.

In the known methods, the handle portion of the donor wafer is typically removed by layer splitting technology, for instance, using the SMART CUT® technology, or by grinding with or without chemical mechanical polishing/planarization (CMP) steps, or other equivalent well-known methods.

In any case, the final stack obtained by known methods typically has a $SiO_2$ oxide layer on top of the waveguide SiN layer and below the transferred monocrystalline Si layer. The starting topology of the deposited $SiO_2$ oxide layer is usually at least equal to the thickness of the waveguide SiN layer, which is typically about 400 nm. However, the target thickness of this oxide layer (below about 300 nm and preferably below 200 nm) has to be very uniform along the entire wafer diameter (within a wafer non-uniformity of below about 10%). Thus, in the prior art, a CMP planarization step is necessary and must be stopped at the required thickness on top of the waveguide SiN patterned layer.

However, such known methods face the technical problem that the planarization methods can, in fact, barely meet the very strict requirements regarding the thickness uniformity of the planarizing oxide layer.

As a consequence, it is desirable to improve the 3-D integration of semiconductor structures, in particular, of semiconductor structures comprising SiN patterned structures, especially with respect to the requirements regarding the thickness uniformity of the planarizing oxide layer covering the SiN patterns, especially for photonic applications.

BRIEF SUMMARY

It is therefore an object of the present disclosure to provide an improved method for manufacturing a semiconductor structure comprising a silicon nitride patterned layer, in particular a SiN patterned structure usable for photonic devices, with which the requirements regarding the thickness uniformity of the planarizing oxide layer covering the patterned layer are met.

The object of the present disclosure is achieved with a method for manufacturing a semiconductor structure comprising the steps of: providing a silicon nitride patterned layer over a carrier substrate, in particular, wherein the silicon nitride patterned layer forms a passive device, providing a first layer of a conformal oxide on the silicon nitride patterned layer, in particular, directly on the silicon nitride patterned layer, such that it fully covers the silicon nitride patterned layer; and planarizing the first layer of conformal oxide to a predetermined thickness above the silicon nitride patterned layer to form a planarizing oxide layer. In the method according to the present disclosure, after the step of planarizing the first layer of conformal oxide, the method further comprises a step of: clearing the silicon nitride patterned layer to form a dished silicon nitride patterned layer; and subsequently, providing a second layer of a conformal oxide on or over the dished silicon nitride patterned layer.

Accordingly, to solve the above-mentioned problem, the present disclosure describes a method that includes not only the planarization of the oxide, but also a subsequent step of clearing of the underlying silicon nitride patterned layer, in particular, the removal, more in particular, the total removal, of the planarizing oxide on top of the patterns of the silicon nitride patterned layer. As mentioned above, the planarization step of the conformal oxide, even to about 100 nm or below, hardly meets the very strict requirements regarding the thickness uniformity of the planarizing oxide layer that are needed for photonic applications. Thus, the method disclosed herein improves the planarity of the exposed surface of the patterned silicon nitride structure with a subsequent step of clearing the silicon nitride patterned layer resulting in a dished silicon nitride patterned layer with a dishing height, and then by providing a new layer of conformal oxide on or over the dished silicon nitride patterned layer. The present disclosure has the advantage over known methods that the new layer of conformal oxide has improved planarity properties in comparison to the planarizing oxide layer resulting from the planarizing step. Depending on the variant of a preferred embodiment, the step of providing the second layer of conformal oxide can be carried out by depositing the second layer of conformal oxide or by re-oxidizing the dished silicon nitride patterned layer.

As will be explained in the following, the manufacturing method allows, for instance, a subsequent (re-)deposition of a thin layer of an oxide that improves the bonding to a donor semiconductor structure in a layer transfer process while maintaining a high level of uniformity above the silicon nitride patterned layer. As a consequence, the present disclosure finds a particularly advantageous application in photonic applications, which results in devices with improved properties compared to photonic circuits manufactured by known methods.

In preferred embodiments, the silicon nitride (SiN) patterned layer is suitable for manufacturing a passive photonic device or structure. Further, the carrier substrate can preferably be a wafer of a semiconductor material, in particular, a silicon wafer, without, however, being restricted thereto.

Preferably, the first layer of a conformal oxide can be provided such that it fully covers the silicon nitride patterned layer, in particular, over the diameter of the underlying wafer. In other words, the oxide layer can be provided in-between the patterns of the silicon nitride patterned layer and on top of the silicon nitride patterns up to a predetermined height or thickness. Further, a conformal oxide for the first and/or second layers of conformal oxide can, for instance, be silicon dioxide ($SiO_2$), without being restricted thereto.

In some embodiments, the step of providing the first layer of conformal oxide can comprise depositing the first layer of conformal oxide. In particular, this step can be carried out by known deposition methods, such as a chemical vapor deposition (CVD), a high-density plasma chemical vapor deposition (HDP CVD), or the like.

In some embodiments, the step of planarizing the first layer of conformal oxide can be carried out using known methods such as a chemical-mechanical planarization (CMP), or the like. Further, the step of providing the first layer of conformal oxide can be stopped, preferably, at a thickness of about 1.5 times the thickness of the silicon nitride patterned layer. Furthermore, in the step of planarizing the first layer of conformal oxide, the predetermined thickness can be about 100 nm above the silicon nitride patterned layer. This thickness was found advantageous to perform the subsequent step of clearing the silicon nitride patterned layer.

In preferred embodiments, the step of clearing the silicon nitride patterned layer can comprise a selective chemical-mechanical planarization (CMP) of the planarizing oxide layer. Further, preferably, the selective CMP can be stopped on top of the silicon nitride patterned layer, that is, on top of the patterns of the silicon nitride patterned layer. A selective CMP was found advantageous such that substantially only the conformal oxide on top of the patterns of the silicon nitride patterned layer can be removed while the silicon nitride patterns are left substantially unaffected by the selective CMP.

Further, it was found that by appropriately choosing the composition of the slurry to be used for the selective CMP, after the selective CMP treatment combined with a subsequent (re-)deposition of a thin layer of an oxide, the planarity of the exposed surface of the silicon nitride patterned structure was improved in comparison to the planarity of the planarizing oxide in the known methods, wherein, as explained above, a (non-selective) CMP planarization step is carried out and is stopped at a required thickness on top of the waveguide SiN patterned layer, resulting in that the very strict requirements for photonic applications were hardly met. In contrast, with the step of clearing and its resulting improvement of the planarity of the exposed surface of the silicon nitride patterned structure, the method disclosed herein leads to a bondable wafer meeting all the planarity and thickness uniformity requirements for photonic applications.

In preferred embodiments, the selective CMP can be carried out using a ceria-based slurry, in particular, a slurry having a composition comprising one of about 0.5 wt. % $CeO_2$, about 0.5 wt. % $CeO_2$ and about 0.1 wt. % picolinic acid, $CeO_2$ and surfactant, or $CeO_2$ and resin abrasive. Studies of Liang-Yong et al. (Origin of high oxide to nitride polishing selectivity of ceria-based slurry in the presence of picolinic acid; Chinese Physics B, Volume 20, Number 3, 2011) and Matsui et al. (High-performance CMP Slurry with $CeO_2$/Resin Abrasive for STI formation; ECS Transactions, Volume 11, Issue 6, Pages 277-283, 2007) have shown that selective CMP processes using ceria-based slurries can result in a preferential removal of the oxide with minimal polishing of the silicon nitride, which meets the requirements of STI patterns. In particular, as discussed by Liang-Yong et al., it is possible to obtain an oxide to nitride selectivity of about 3.4 when using slurries having a composition comprising about 0.5 wt. % $CeO_2$, and of as high as about 76.6 when the slurry has a composition comprising about 0.5 wt. % $CeO_2$ and about 0.1 wt. % picolinic acid. Further, as discussed by Matsui et al., it is possible to obtain an oxide to nitride selectivity of about 47.1 when using a slurry having a composition comprising $CeO_2$ and surfactant, and of as high as about 124.6 when the slurry has a composition comprising $CeO_2$ and resin abrasive. A clearing by selective CMP using these particular compositions was found to significantly improve the surface roughness of the exposed surface of the (passive) silicon nitride patterned structure, such that a subsequent bonding and layer transfer for co-integration with another (active) patterned structure yielded significant improvements of the quality of resulting photonic devices. In cases where a (re-)deposition of a thin oxide layer is required for the bonding step in a layer transfer process, a surface roughness of below about 5 Å rms was observed.

In variants of a preferred embodiment, the step of clearing can further comprise dishing the oxide in-between patterns of the silicon nitride patterned layer. Further, when the dishing height is too high to ensure the proper bonding to a donor semiconductor structure in a layer transfer process, the method can further comprise repeating the steps of clearing the silicon nitride patterned layer and of subsequently providing a (new) second layer of a conformal oxide, wherein the further oxide layer is then provided with a thickness of about 1.5 times the dishing height of the previously obtained dished silicon nitride patterned layer. The repeated step of dishing the oxide in-between patterns of the silicon nitride patterned layer in combination with the (re-)deposition of a thin oxide layer on the silicon nitride patterned layer was found particularly advantageous in view of a subsequent layer transfer process, as it allows further improvement of the thickness uniformity.

In some embodiments, the thickness of the second layer of conformal oxide, in particular, of the last layer of conformal oxide when repeating the steps of clearing the silicon nitride patterned layer and of providing the second layer of conformal oxide, above the dished silicon nitride patterned layer can be less than about 50 nm, in particular, less than 20 nm, more in particular, less than 5 nm. The thickness uniformity can then be higher than about 20%. This step can be, in particular, a (re-)deposition of the conformal oxide. Instead, or in addition, the silicon nitride patterned layer could also be re-oxidized. In this way, it is possible to ensure adequate bonding of the silicon nitride patterned structure to a donor semiconductor structure in view of a layer transfer. With the inventive method, a surface roughness of below about 5 Å rms was observed, for instance, after such a step of (re-)deposition of a thin layer of oxide.

The inventive method is suitable for a layer transfer process, in particular, in view of the co-integration of passive and active semiconductor structures. Thus, in some embodiments, the method can further comprise the steps of: providing a donor substrate comprising a detachable semiconductor layer; and transferring the detachable semiconductor layer onto the silicon nitride patterned layer, in particular, after the step of providing the second layer of conformal oxide or after providing the last layer of conformal oxide in case of repeating this step. Without being limited thereto, the donor substrate can be a silicon (Si) wafer, a silicon-on-insulator wafer, or the like. Further, also without being limited thereto, the detachable semiconductor layer can be a layer of silicon or a silicon-based material. The layer transfer process can be carried out using known methods, for instance, the SMART CUT® technology. Thus, the detachable semiconductor layer can be provided in various different ways, in particular, by ion implantation when SMART CUT® is used. Accordingly, the remainder or handle portion of the donor substrate can be removed using layer splitting technology, but the present disclosure is not limited thereto, and other methods for removing the donor substrate are conceivable, for instance, grinding with or without CMP planarization steps, or other known methods.

Further, when the inventive method is used in a layer transfer process, the method can further comprise patterning the detachable semiconductor layer of the donor substrate to form an active device before and/or after the layer transfer. In other words, the inventive method facilitates the co-integration of passive and active structures.

In some embodiments, before the step of transferring, the method can further comprise a step of providing a bonding layer on the detachable semiconductor layer, in particular, providing a thin layer of a conformal oxide on the detachable semiconductor layer, in particular, the exposed surface thereof, of the donor substrate.

In some embodiments, the detachable semiconductor layer can be of silicon, and the bonding layer can be obtained by thermal oxidation of the detachable semiconductor layer. This configuration was found advantageous because thermal oxidation leads to much higher uniformity such as, for instance, oxide deposition.

Thus, in variants of preferred embodiments, the combined thickness of the second layer of conformal oxide, or of the last layer of conformal oxide when repeating the step of providing the second layer of conformal oxide, above the dished silicon nitride patterned layer and of the bonding layer can be in the range from about 50 nm to about 300 nm, while respecting a high uniformity at the bonding interface. A very low thickness of deposited oxide on the dished silicon nitride patterned layer can be combined with a given thickness of a thermal oxide used for the bonding layer to ensure such uniformity at the bonding interface, thereby providing high bonding strength. For photonic devices, this leads to substantially perfect coupling between the SiN waveguides and the active devices in the detachable semiconductor layer.

Finally, the object of the present disclosure is also achieved with a photonic device manufactured using any of the variants of the inventive method. Since the thickness uniformity of the exposed surface of the silicon nitride patterned structure before bonding is improved with respect to the prior art, after the layer transfer, the inventive method leads to improved co-integrated semiconductor structures. In particular, it is possible to obtain photonic devices with improved properties in comparison to photonic circuits and the like obtained by known methods.

BRIEF DESCRIPTION OF THE DRAWINGS

The method disclosed herein is explained in more detail hereafter using advantageous exemplary embodiments in conjunction with the accompanying figures, wherein.

DETAILED DESCRIPTION

In the following description of exemplary embodiments of the present disclosure, the same reference signs can be used to designate the same features throughout the different embodiments. Furthermore, in some embodiments, the description of features described in previous embodiments may be omitted.

Steps of a method for manufacturing a semiconductor structure according to the present disclosure will now be described in a first exemplary embodiment with reference to FIG. 1.

Figure 1:
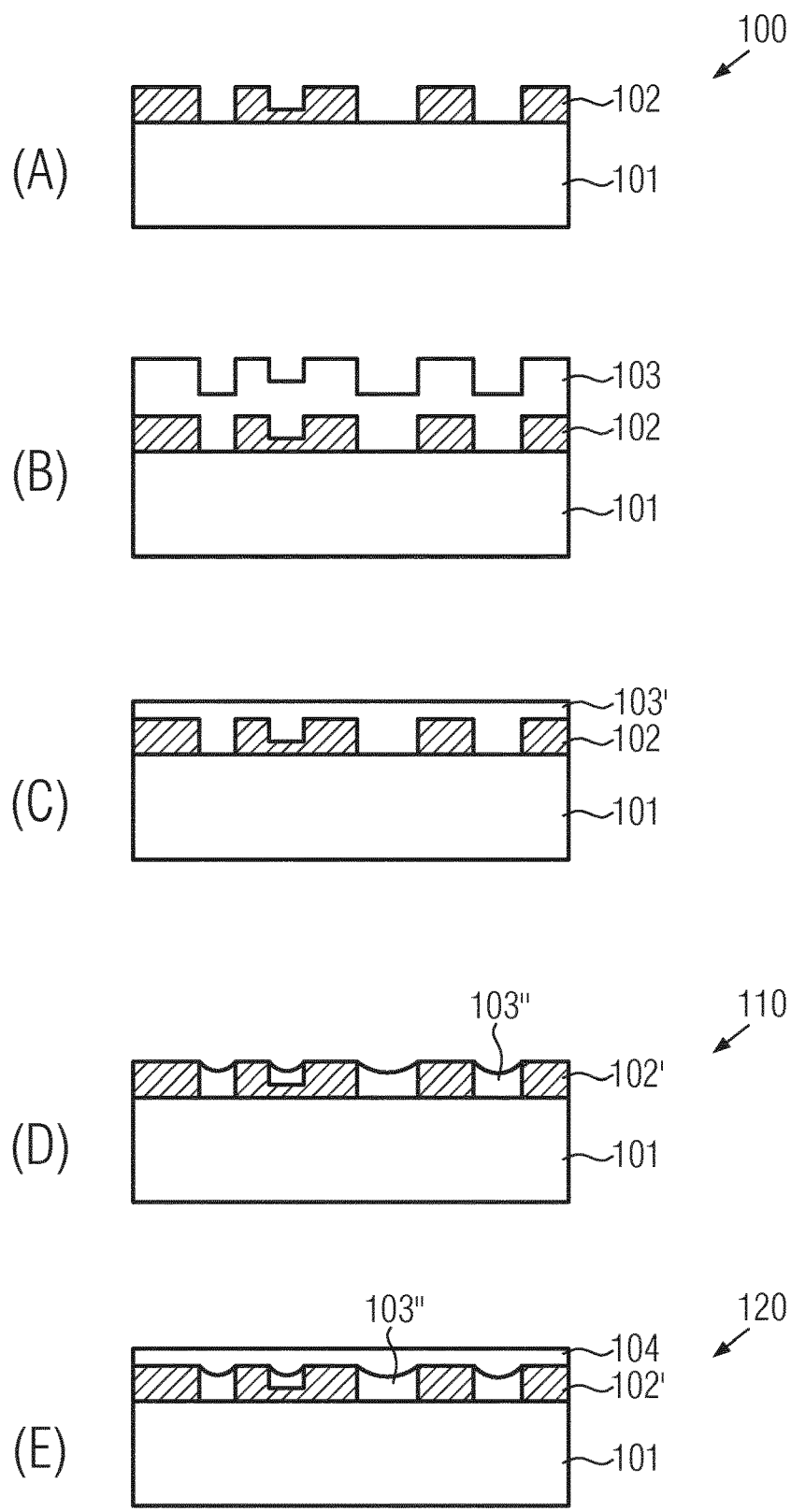
FIG. 1 schematically illustrates steps of a method for manufacturing a semiconductor structure according to a first exemplary embodiment of the present disclosure.

As illustrated in step (A) of FIG. 1, a silicon nitride patterned layer 102 is provided on or over a carrier substrate 101, which form together a silicon nitride patterned structure 100. Silicon nitride (SiN), which is a preferred material for photonic applications, can be used but other nitride-based materials or semiconductor materials could also be suitable depending on the applications.

The silicon nitride (SiN) patterned layer 102 of the first embodiment can be provided as a passive photonic structure. Thus, the SiN patterned layer 102 can comprise patterns, or the like, which may have been formed using, for instance, one or more etching steps with corresponding masks. Other embodiments could relate to patterns present in the gate stack of a transistor, or the like. One or more annealing steps can be used at this point or later, as appropriate, for strengthening the SiN patterned layer 102 depending on the desired applications.

Further, in the first embodiment, the carrier substrate 101 is a silicon wafer, but other materials could be used in different embodiments also depending on the intended applications. The assembly between the carrier substrate 101 and the SiN patterned layer 102 can be realized, for instance, using an intermediate oxide layer, e.g., $SiO_2$ or the like (not illustrated), an adhesive layer, or other appropriate well-known methods.

As illustrated in step (B) of FIG. 1, in a subsequent step, a first layer of a conformal oxide 103 is provided on the SiN patterned layer 102, in particular, directly thereon, and such that it fully covers the SiN patterned layer 102, preferably over the entire diameter of the underlying Si wafer 101. In this embodiment, the first layer of conformal oxide 103 is stopped at a height of about 1.5 times the thickness of the SiN patterned layer 102. Thus, as also illustrated, the conformal oxide is also provided in-between the (STI) patterns of the SiN patterned layer 102. Because of the patterns of the SiN patterned layer 102, the first layer of conformal oxide 103 display corresponding surface irregularities and/or roughness.

In the first embodiment, a conformal oxide can be silicon dioxide ($SiO_2$), such that the first layer of conformal oxide 103 can also be referred to as the first $SiO_2$ layer 103 or simply the $SiO_2$ layer 103 hereafter, and the first $SiO_2$ layer 103 is provided on the SiN patterned layer 102 by chemical vapor deposition (CVD), in particular, high-density plasma chemical vapor deposition (HDP CVD), although other known methods and/or oxides may be used in other embodiments.

As illustrated in step (C) of FIG. 1, in a subsequent step, the $SiO_2$ layer 103 is planarized to a predetermined thickness above the SiN patterned layer 102, thereby forming a planarizing $SiO_2$ layer 103'. In the first embodiment, the planarizing $SiO_2$ layer 103' is formed using a step of chemical-mechanical planarization (CMP). In variants of this embodiment or in other embodiments of the inventive method, well-known planarizing methods other than CMP could be used, and/or the height of the planarizing $SiO_2$ layer 103' above the SiN patterned layer 102 could be about 100 nm or even less.

As mentioned above, at this point, the planarizing $SiO_2$ layer 103' hardly meets the very strict requirements regarding the thickness uniformity that are needed for photonic applications.

Thus, as illustrated in step (D) of FIG. 1, according to the present disclosure, after realizing the planarizing $SiO_2$ layer 103', a step of clearing the SiN patterned layer 102, in other words, the removal of the planarizing $SiO_2$ layer 103' on top of the SiN patterned layer 102, is carried out in order to improve the planarity of the exposed surface of the resulting structure 110 that, if desired, can subsequently be bonded, for instance, to an active photonic structure in a layer transfer process to achieve the co-integration of both passive and active structures in the same device.

In the first embodiment, the clearing of the SiN patterned layer 102 is achieved by a selective CMP of the planarizing $SiO_2$ layer 103', which is stopped essentially on top of the (STI) patterns of the SiN patterned layer 102, while leaving the patterns and, therefore, the SiN patterned layer 102 essentially unaffected by the selective CMP, and leaving only dished $SiO_2$ pockets 103" in-between the patterns of the SiN patterned layer 102, resulting in a dished silicon nitride (SiN) patterned layer 102'. In the first embodiment, this is possible by appropriately choosing the composition of the slurry to be used for the selective CMP.

In this respect, in the first embodiment, a ceria-based slurry is preferred. In particular, ceria-based slurries are preferred, which allow reaching high oxide to nitride selectivity ratios, while improving the surface roughness of the exposed surface on top of the structure 110. Thus, in the first embodiment, the slurry to be used for the selective CMP is chosen with a composition comprising one of: about 0.5 wt. % $CeO_2$, about 0.5 wt. % $CeO_2$ and about 0.1 wt. % picolinic acid, $CeO_2$ and surfactant, or $CeO_2$ and resin abrasive, which all result in a preferential removal of the oxide with minimal polishing of the silicon nitride, while also meeting the requirements of STI patterns. Indeed, in variants of the first embodiment, depending on which ceria-based slurry is used, it is possible to reach an oxide to nitride selectivity of: about 3.4 when using the slurry having a composition comprising about 0.5 wt. % $CeO_2$; as high as about 76.6 when the slurry has the composition comprising about 0.5 wt. % $CeO_2$ and about 0.1 wt. % picolinic acid; about 47.1 when using a slurry having a composition comprising $CeO_2$ and surfactant; or even as high as about 124.6 when the slurry has a composition comprising $CeO_2$ and resin abrasive.

Thus, the planarity of the exposed surface on top of the dished SiN patterned layer 102' in the resulting structure 110 illustrated in step (D) of FIG. 1 is significantly improved in comparison to that of the structure resulting from step (C). Accordingly, if the structure 110 is co-integrated with an active photonic structure, it will result in a photonic device with improved properties compared to a photonic device manufactured using known methods.

Then, as illustrated in step (E) of FIG. 1, the first embodiment further comprises a subsequent step of providing, in particular, depositing or re-depositing, a second layer of an oxide 104, in particular, a conformal oxide, on top of the exposed surface formed by the dished SiN patterned layer 102' with the dished $SiO_2$ pockets 103" in-between the patterns. In the first embodiment, the second layer of conformal oxide 104 is a layer of $SiO_2$, but the skilled reader will appreciate that other conformal oxides may be used. Thus, in the following, the second layer of conformal oxide 104 can also be referred to as the second $SiO_2$ layer 104 or simply the $SiO_2$ layer 104.

Further, in the first embodiment, the second $SiO_2$ layer 104 can be a thin layer having a thickness of less than about 50 nm, preferably less than about 20 nm, or even more preferably less than about 5 nm. The surface roughness observed for the second $SiO_2$ layer 104 is below about 5 Å rms, such that the thickness uniformity meets the very strict requirements of photonic applications. In other words, it is possible to ensure adequate bonding of the resulting semiconductor structure 120 to a donor semiconductor structure in view of a layer transfer.

A second exemplary embodiment of the inventive method for manufacturing a semiconductor structure will now be described with reference to FIG. 2, wherein the semiconductor structure 120 resulting from the first embodiment or an analog semiconductor structure resulting from any variant of the first embodiment is prepared in view of manufacturing a co-integrated photonic device with both active and passive structures. As will become obvious hereafter, the second embodiment can be seen as a variant of the first embodiment.

As mentioned above, the step of clearing the SiN patterned layer 102 described in reference to step (D) of FIG. 1 leads to the dished SiO$_2$ pockets 103" in-between patterns in the dished SiN patterned layer 102'. In fact, depending on the structure of the patterns of the SiN patterned layer 102, the dishing step can also comprise an over-polishing step for the wafer edge. Further, with a ceria-based slurry having a very high oxide to nitride selectivity, it would be possible to stop the selective CMP at a desired dishing height of the dished SiN patterned layer 102'.

Furthermore, in the second embodiment, in a step that would be subsequent to step (E) illustrated in FIG. 1, a planarizing oxide layer 104' of a conformal oxide, for instance, also SiO$_2$, or any other suitable oxide, can be provided on top of the exposed surface formed by the dished SiN patterned layer 102' with the dished SiO$_2$ pockets 103" in-between the patterns, thereby forming semiconductor structure 130. In fact, the method steps of clearing the SiN patterned layer 102 and of subsequently providing a second layer of a conformal oxide 104', which is a conformal planarizing oxide layer, can be repeated. In particular, it is preferable that the new planarizing oxide layer 104' is provided with a thickness of about 1.5 times the dishing height in the step of dishing. This step can be advantageous when the dishing height in the step of dishing is too high to ensure the proper bonding to a donor semiconductor structure in a layer transfer process.

Then, in a variant of the second embodiments, the second layer of conformal oxide 104 of the first embodiment could be deposited directly on top of the exposed surface formed by the dished SiN patterned layer 102' and the dished SiO$_2$ pockets 103" in-between the patterns, or on top of the planarizing oxide 104' of the structure 130. Further, in other variants, it would also be possible to further repeat the steps of clearing and providing a planarizing oxide layer 104' to further improve the uniformity.

Figure 2:
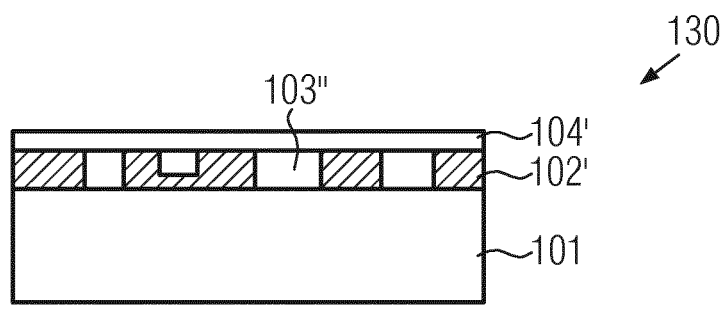
FIG. 2 schematically illustrates a silicon nitride patterned structure manufactured according to a second exemplary embodiment of the present disclosure.

FIG. 2 essentially illustrates that the structure 130 obtained in the second embodiment is very similar to the structure 120 obtained in the first embodiment. Since the repeated steps of clearing the SiN patterned layer 102 and providing another conformal oxide 104, here resulting in the planarizing oxide layer 104', are repeated, the thickness uniformity is improved even more than in the first embodiment. Thus, the dishing is not shown in FIG. 2 on purpose in order to schematically emphasize even more the improvement of uniformity obtained by the present disclosure.

A third exemplary embodiment of the inventive method for manufacturing a semiconductor structure will now be described with reference to FIGS. 3 and 4, wherein any of the structures 120, 130 resulting from any of the first or second embodiments or analog structures resulting from any variant thereof will be used in a layer transfer process, in particular, for a co-integration with an active photonic structure.

Figure 3:
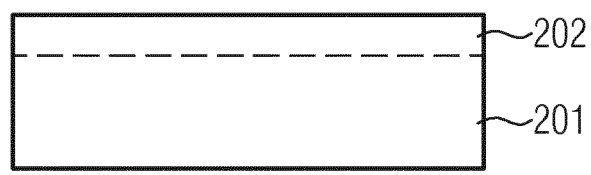
FIG. 3 schematically illustrates a step of providing a donor substrate in view of carrying out a layer transfer onto any one of the structures provided in the embodiments illustrated in FIGS. 1 and 2.

As illustrated in FIG. 3, in the third embodiment, a donor substrate 201 is provided in view of a layer transfer onto one of the structures 120, 130 obtained by one of the previous embodiments. Accordingly, a detachable semiconductor layer 202 is provided in or on the donor substrate 201. In the third embodiment, a layer transfer using the SMART CUT® technology is carried out. Thus, in the third embodiment, the detachable semiconductor layer 202 is provided by creating a weakened (splitting) layer (represented by the dashed line in FIG. 3) by ion implantation at a predetermined depth in the donor substrate 201. In variants of the third embodiment, other technologies could be used for the layer transfer, and the detachable semiconductor layer 202 could be attached in a detachable manner to the donor substrate 201, for instance, with a weak or non-permanent adhesive, or using an oxide layer, or the like.

In the third embodiment, the donor substrate is a Si bulk wafer, and the detachable semiconductor layer 202 is a Si layer. In other embodiments, the donor substrate could be a silicon wafer, a silicon-on-insulator wafer, or the like, and the detachable semiconductor layer could be a layer of a silicon-based material, or another semiconductor material.

Figure 4:
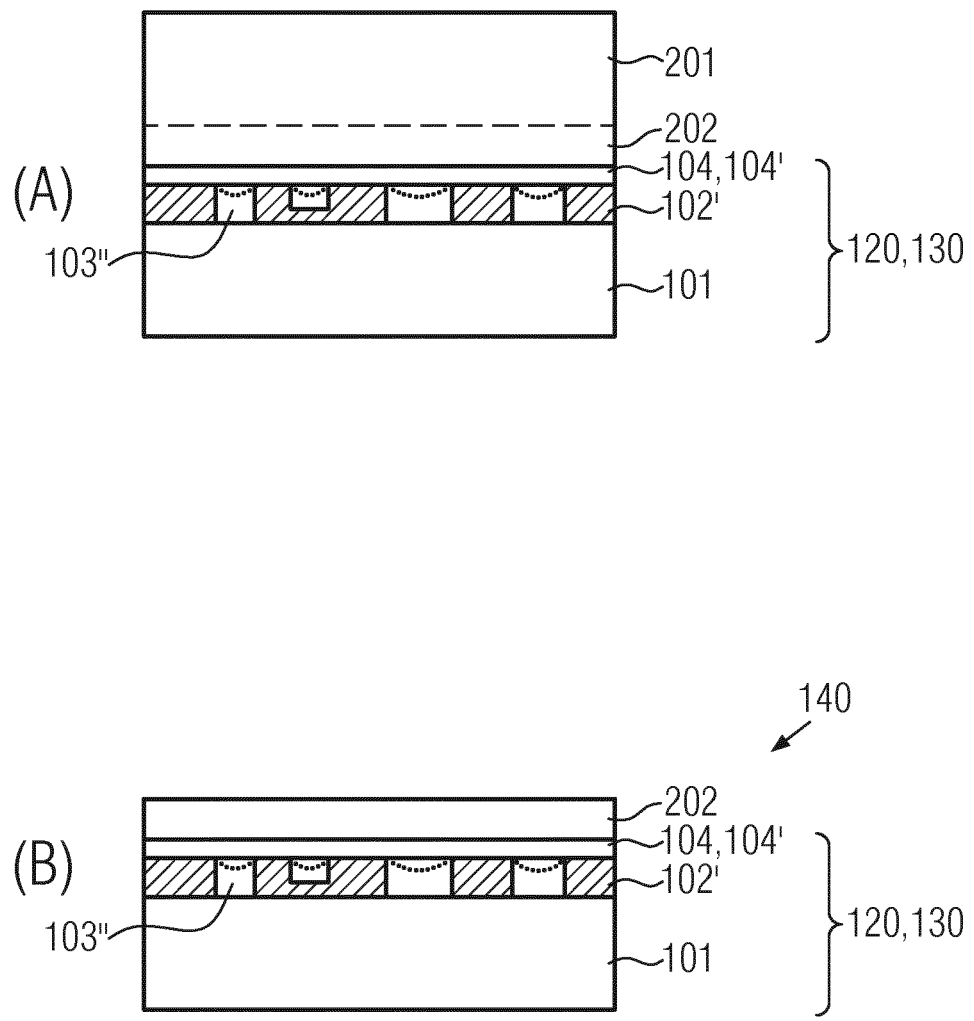
FIG. 4 schematically illustrates steps of transferring a layer from the donor substrate illustrated in FIG. 3 onto any one of the structures provided in the embodiments illustrated in FIGS. 1 and 2, in a third exemplary embodiment of the present disclosure.

As illustrated in step (A) of FIG. 4, the donor Si wafer 201 is bonded to one of the structures 120, 130 obtained by one of the previous embodiments (dotted lines emphasize the dished SiO$_2$ pockets 103"). In particular, a free bonding surface of the detachable Si layer 202 to be transferred is bonded to the free bonding surface formed by one of: the second SiO$_2$ layer 104 for the structure 120 obtained by the first embodiment or variants thereof; or the planarizing SiO$_2$ layer 104' for the structure 130 obtained by the second embodiment or variants thereof.

In some variants, instead of or in addition to providing the thin second SiO$_2$ layer 104 as described above in the first or second embodiments, a layer of a conformal oxide can be provided on the free (bonding) surface of the detachable Si layer 202 that will be transferred onto the structure 120, 130 in the layer transfer process. In further variants, it would also be possible to re-oxidize the dished SiN patterned layer 102' and/or the bonding surface of the detachable Si layer 202. In other words, in variants of this aspect of the inventive method, a bonding oxide layer can be provided on the receiver silicon nitride patterned structure, on the detachable layer of the donor substrate, or on both, depending on the desired strength of the bonding.

In some variants, the detachable semiconductor layer 202 can be of silicon and the bonding layer on the detachable semiconductor layer 202 can be obtained by thermal oxidation of the detachable semiconductor layer 202. This is advantageous because thermal oxidation leads to much higher uniformity, such as, for instance, oxide deposition.

Thus, in variants of the third embodiment, the combined thickness of the last deposited layer of conformal oxide, namely the second SiO$_2$ layer 104 when following variants of the first embodiment or the last deposited planarizing SiO$_2$ layer 104' when following variants of the second embodiment, above the dished SiN patterned layer 102' and of the bonding layer can preferably be in the range from about 50 nm to about 300 nm, while respecting a high uniformity at the bonding interface. A very low thickness of deposited oxide on the dished SiN patterned layer 102' can be combined with a certain thickness of a thermal oxide used for the bonding layer to ensure such uniformity at the bonding interface, thereby providing high bonding strength. For photonic devices, this leads to a substantially perfect coupling between the SiN waveguides and the active devices in the detachable semiconductor layer 202.

Then, as illustrated in step (B) of FIG. 4, the remainder or handle portion of the donor Si wafer 201 is detached, in particular, following a heat treatment in a layer transfer by SMART CUT® technology, such that the detachable Si layer 202 is now transferred onto the dished SiN patterned layer 102' with the second SiO$_2$ layer 104 (or 104') with improved planarity and thickness uniformity, forming the co-integrated semiconductor structure 140. Further surface treatment steps (grinding, etching, planarization, polishing, etc.) can then be carried out on the transferred Si layer 202 depending on the intended use of the semiconductor structure 140.

In variants of the third embodiment, instead of transferring the layer by a splitting technology such as the SMART CUT® technology, it would also be possible to remove the remainder or handle portion of the donor substrate, for instance, by grinding with or without CMP planarization steps, or any other known suitable method.

Further, the Si layer 202 can be patterned, in particular, into an active device, for instance, using one or more etching and masking steps. The patterning of the Si layer 202, as well as optional strengthening annealing steps, can be carried out before and/or after the layer transfer. In any case, the skilled reader will appreciate that the inventive method facilitates the co-integration of passive and active structures.

As a consequence, when the silicon nitride patterned layer, here the SiN patterned layer 102, forms a passive device, in particular, a passive photonic structure, and the transferred layer, here the Si layer 202, forms an active device, in particular, an active photonic structure, the resulting co-integrated semiconductor structure 140 can be used for photonic applications. For instance, electrical connections could be added in further method steps in order to realize a photonic circuit. Given the advantages resulting of the inventive manufacturing method, a photonic device such as the semiconductor structure 140 or using the same will have improved properties with respect to an analog device manufactured by known methods. In particular, the bonding strength and the coupling between the passive and the active structures is improved in comparison to the prior art.

Finally, the skilled reader will appreciate that the embodiments described above are merely illustrative of the concepts underlying the present disclosure, and that further embodiments may deviate from the examples given above without, however, deviating from the scope of the present disclosure. In particular, the various embodiments of the present disclosure described above and/or their variants can also be combined with each other to form further embodiments still within the scope of the present disclosure.

The invention claimed is:

1. A method for manufacturing a semiconductor structure, comprising the steps of:
   providing a silicon nitride patterned layer over a carrier substrate, the silicon nitride patterned layer forming a passive device;
   depositing a first layer of a conformal oxide on the silicon nitride patterned layer such that the conformal oxide fully covers the silicon nitride patterned layer, the first layer of conformal oxide conforming to the silicon nitride patterned layer upon the deposition; and
   planarizing the first layer of conformal oxide to a predetermined thickness above the silicon nitride patterned layer to form a planarizing oxide layer;
   wherein, after the step of planarizing the first layer of conformal oxide, the method further comprises the steps of:
   clearing the silicon nitride patterned layer to form a dished silicon nitride patterned layer with a dishing height; and
   subsequently providing a second layer of a conformal oxide on or over the dished silicon nitride patterned layer, the second layer of conformal oxide conforming to the silicon nitride patterned layer and a thickness of the second layer of conformal oxide above the dished silicon nitride patterned layer is less than 300 nm and a thickness of the second layer of conformal oxide above the dished silicon nitride patterned layer is less than 300 nm.

2. The method of claim 1, wherein the step of providing the first layer of conformal oxide comprises depositing the first layer of conformal oxide.

3. The method of claim 2, wherein depositing the first layer of conformal oxide comprises depositing the first layer of conformal oxide using a chemical vapor deposition (CVD) process.

4. The method of claim 3, wherein depositing the first layer of conformal oxide using a chemical vapor deposition (CVD) process comprises using a high-density plasma chemical vapor deposition (HDP CVD) process.

5. The method of claim 1, wherein the step of providing the first layer of conformal oxide is stopped at a thickness of about 1.5 times the thickness of the silicon nitride patterned layer.

6. The method of claim 1, wherein, in the step of planarizing the first layer of conformal oxide, the predetermined thickness is about 100 nm above the silicon nitride patterned layer.

7. The method of claim 1, wherein the step of clearing the silicon nitride patterned layer comprises performing a selective chemical-mechanical planarization (CMP) of the planarizing oxide layer and stopping on top of the silicon nitride patterned layer.

8. The method of claim 7, wherein the selective CMP is carried out using a ceria-based slurry.

9. The method of claim 8, wherein the ceria-based slurry has a composition comprising one of about 0.5 wt. % $CeO_2$, about 0.5 wt. % $CeO_2$ and about 0.1 wt. % picolinic acid, $CeO_2$ and a surfactant, or $CeO_2$ and a resin abrasive.

10. The method of claim 1, wherein the second layer of conformal oxide is provided by depositing the second layer of conformal oxide or by re-oxidizing the dished silicon nitride patterned layer.

11. The method of claim 1, further comprising repeating the steps of clearing the silicon nitride patterned layer and of subsequently providing a second layer of a conformal oxide, wherein the second layer of conformal oxide is provided with a thickness of about 1.5 times the dishing height of the previously obtained dished silicon nitride patterned layer.

12. A method for manufacturing a semiconductor structure, comprising the steps of:
   providing a silicon nitride patterned layer over a carrier substrate, the silicon nitride patterned layer forming a passive device;
   providing a first layer of a conformal oxide on the silicon nitride patterned layer such that the conformal oxide fully covers the silicon nitride patterned layer; and
   planarizing the first layer of conformal oxide to a predetermined thickness above the silicon nitride patterned layer to form a planarizing oxide layer;
   wherein, after the step of planarizing the first layer of conformal oxide, the method further comprises the steps of:
   clearing the silicon nitride patterned layer to form a dished silicon nitride patterned layer with a dishing height; and
   subsequently providing a second layer of a conformal oxide on or over the dished silicon nitride patterned layer; and
   wherein a final thickness of the second layer of conformal oxide above the dished silicon nitride patterned layer is less than about 50 nm, and wherein said thickness has a uniformity higher than about 20%.

13. The method of claim 1, further comprising the steps of:
   providing a donor substrate comprising a detachable semiconductor layer; and
   transferring the detachable semiconductor layer onto the dished silicon nitride patterned layer after the step of providing the second layer of conformal oxide.

14. The method of claim 13, further comprising patterning the detachable semiconductor layer to form an active device before and/or after the step of transferring.

15. The method of claim 13, further comprising, before the step of transferring, providing a bonding layer on the detachable semiconductor layer.

16. The method of claim 15, wherein the detachable semiconductor layer comprises silicon, and wherein the bonding layer is provided by thermal oxidation of the detachable semiconductor layer.

17. The method of claim 15, wherein a final thickness of the second layer of conformal oxide above the dished silicon nitride patterned layer and of the bonding layer is in a range extending from about 50 nm to about 300 nm.

18. A photonic device manufactured using the method according to claim 1.

19. The method of claim 12, wherein the final thickness of the second layer of conformal oxide above the dished silicon nitride patterned layer is less than about 5 nm.

* * * * *

UNITED STATES PATENT AND TRADEMARK OFFICE
CERTIFICATE OF CORRECTION

PATENT NO. : 11,156,778 B2  
APPLICATION NO. : 16/323238  
DATED : October 26, 2021  
INVENTOR(S) : Bich-Yen Nguyen and Gweltaz Gaudin Page 1 of 1

It is certified that error appears in the above-identified patent and that said Letters Patent is hereby corrected as shown below:

In the Claims

Claim 1, Column 12, Lines 1-3, change "300 nm and a thickness of the second layer of conformal oxide above the dished silicon nitride patterned layer is less than 300 nm." to --300 nm.--

Signed and Sealed this  
Twenty-second Day of February, 2022

Drew Hirshfeld  
*Performing the Functions and Duties of the*  
*Under Secretary of Commerce for Intellectual Property and*  
*Director of the United States Patent and Trademark Office*